(12) United States Patent
Liang et al.

(10) Patent No.: US 11,581,461 B2
(45) Date of Patent: Feb. 14, 2023

(54) DISPLAY SUBSTRATE, PREPARATION METHOD THEREOF, AND DISPLAY DEVICE

(71) Applicant: BOE Technology Group Co., Ltd., Beijing (CN)

(72) Inventors: Zhiwei Liang, Beijing (CN); Wenqian Luo, Beijing (CN); Yingwei Liu, Beijing (CN); Zhanfeng Cao, Beijing (CN); Ke Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 233 days.

(21) Appl. No.: 16/917,921

(22) Filed: Jul. 1, 2020

(65) Prior Publication Data
US 2021/0043817 A1    Feb. 11, 2021

(30) Foreign Application Priority Data

Aug. 6, 2019    (CN) .......................... 201910720376.2

(51) Int. Cl.
*H01L 33/62* (2010.01)
*H01L 27/15* (2006.01)
*H01L 33/00* (2010.01)
*H01L 33/56* (2010.01)

(52) U.S. Cl.
CPC ............ *H01L 33/62* (2013.01); *H01L 27/156* (2013.01); *H01L 33/0095* (2013.01); *H01L 33/56* (2013.01); *H01L 2933/005* (2013.01); *H01L 2933/0066* (2013.01)

(58) Field of Classification Search
CPC ... H01L 33/62; H01L 27/156; H01L 33/0095; H01L 33/56; H01L 2933/005; H01L 2933/0066; H01L 25/167; H01L 24/83; H01L 27/15; H01L 2224/832
See application file for complete search history.

(56) References Cited

U.S. PATENT DOCUMENTS

| | | | | |
|---|---|---|---|---|
| 11,335,712 B2 * | 5/2022 | Liang | ..................... | H01L 27/127 |
| 11,355,478 B2 * | 6/2022 | Zhang | ................. | H01L 25/0753 |
| 11,387,220 B2 * | 7/2022 | Jang | .................... | H01L 25/0753 |

(Continued)

FOREIGN PATENT DOCUMENTS

| CN | 1776892 A | 5/2006 |
|---|---|---|
| CN | 1855461 A | 11/2006 |

(Continued)

OTHER PUBLICATIONS

Office Action dated Mar. 26, 2021 for Chinese Patent Application No. 201910720376.2 and English Translation.

*Primary Examiner* — Victor A Mandala
(74) *Attorney, Agent, or Firm* — Ling Wu; Stephen Yang; Ling and Yang Intellectual Property

(57) ABSTRACT

A display substrate includes a drive substrate and a welding pad provided on the drive substrate and electrically connected with the drive substrate. The display substrate further includes an insulating construction layer provided on the welding pad. The insulating construction layer is provided with a groove for exposing the welding pad. A bonding material is accommodated in the groove, and a micro light emitting diode is electrically connected with the welding pad through the bonding material.

18 Claims, 8 Drawing Sheets

(56) References Cited

U.S. PATENT DOCUMENTS

| | | | |
|---|---|---|---|
| 2007/0023928 A1 | 2/2007 | Kuechenmeister et al. | |
| 2007/0095471 A1 | 5/2007 | Ito et al. | |
| 2017/0125392 A1* | 5/2017 | Bibl | H01L 33/0008 |
| 2019/0006329 A1* | 1/2019 | Hashim | H01L 25/0753 |
| 2019/0114958 A1* | 4/2019 | Shin | H01L 27/1214 |
| 2019/0148611 A1* | 5/2019 | He | H01L 24/29 |
| | | | 257/72 |
| 2019/0198735 A1* | 6/2019 | Tsai | H01L 33/06 |
| 2019/0319015 A1* | 10/2019 | Schuele | H01L 25/0753 |
| 2020/0013686 A1* | 1/2020 | Kao | H01L 25/167 |
| 2020/0043400 A1* | 2/2020 | Chen | H01L 33/08 |
| 2020/0135706 A1* | 4/2020 | Sa | H01L 25/167 |
| 2020/0343271 A1* | 10/2020 | Kao | H01L 25/167 |
| 2020/0381363 A1* | 12/2020 | Wu | H01L 25/167 |
| 2020/0381410 A1* | 12/2020 | Yueh | H01L 25/167 |
| 2020/0411560 A1* | 12/2020 | Kao | H01L 27/0296 |
| 2021/0265327 A1* | 8/2021 | Koo | H01L 33/62 |
| 2021/0398952 A1* | 12/2021 | Zhang | H01L 25/167 |
| 2021/0408052 A1* | 12/2021 | Liang | H01L 33/62 |
| 2021/0408350 A1* | 12/2021 | Lo | H01L 27/153 |
| 2022/0149254 A1* | 5/2022 | Schuele | H01L 24/00 |

FOREIGN PATENT DOCUMENTS

| | | |
|---|---|---|
| CN | 101154604 A | 4/2008 |
| CN | 101248521 A | 8/2008 |
| CN | 101288350 A | 10/2008 |
| CN | 104427755 A | 3/2015 |
| CN | 204906329 U | 12/2015 |
| CN | 106856218 A | 6/2017 |
| CN | 108011012 A | 5/2018 |
| CN | 109904174 A | 6/2019 |
| CN | 109950270 A | 6/2019 |

* cited by examiner

DISPLAY SUBSTRATE, PREPARATION METHOD THEREOF, AND DISPLAY DEVICE

CROSS-REFERENCE TO RELATED APPLICATION

The present application claims the priority of Chinese Patent Application No. 201910720376.2 filed to the CNIPA on Aug. 6, 2019, the content of which is hereby incorporated by reference.

TECHNICAL FIELD

The present disclosure relates to, but is not limited to the field of display technology, specifically to a display substrate and a preparation method thereof, and a display device.

BACKGROUND

In the Micro Light Emitting Diode (Micro-LED) display, the size of the existing LED is reduced to less than 100 µm, so that the LED size is about 1% of the existing LED size, and then micron-sized Micro-LEDs of R (Red), G (Green) and B (Blue) colors are transferred to a drive substrate through a mass transfer technology, so as to form various sizes of Micro-LED displays. Simply put, the Micro-LED is the thin film, miniaturized and arrayed LED. Each Micro-LED pixel can be addressed and independently driven to emit light. The distance between adjacent pixels is reduced from millimeter level to micrometer level. The Micro-LED has many advantages, such as self-luminous, high brightness, high contrast, ultra-high resolution and color saturation, long service life, fast response speed, energy saving, wide adaptability to environment. The Micro-LED display technology can cover the display fields including micro displays such as Augmented Reality (AR) and Virtual Reality (VR), medium-sized displays such as mobile phones and TVs, and large screen displays in cinemas.

At present, in the Micro-LED display substrate technology, a bonding material, such as silver paste, solder paste, or anisotropic conductive adhesive, is usually used to bond the Micro-LEDs to the display substrate. When using solder paste to bond Micro-LEDs, it is easy to occur that too much solder paste is dispensed, which leads to short circuit between N and P poles of Micro-LEDs, resulting in low efficiency, low yield, and low reliability in bonding of Micro-LEDs.

SUMMARY

The following is a summary of the subject matter described in detail herein. This summary is not intended to limit the scope of protection of the claims.

In one aspect, an embodiment of the disclosure provides a display substrate, comprising a drive substrate and a welding pad provided on the drive substrate and electrically connected with the drive substrate. The display substrate further comprises an insulating construction layer provided on the welding pad. The insulating construction layer is provided with a groove for exposing the welding pad. A bonding material is accommodated in the groove, and a micro light emitting diode is electrically connected with the welding pad through the bonding material.

In some possible implementations, the display substrate further comprises a metal connection layer provided in the groove, an inner side of the metal connection layer forms a sub-groove corresponding to the groove, and the bonding material is accommodated in the sub-groove.

In some possible implementations, the metal connection layer covers a bottom surface and a side surface of the groove, and the thickness of the metal connection layer is 2500 to 3500 angstroms.

In some possible implementations, the depth of the sub-groove is greater than 3 µm.

In some possible implementations, the drive substrate comprises a base substrate and a drive structure layer disposed on the base substrate, and a sidewall of the groove is perpendicular to the base substrate.

In some possible implementations, the height of the bonding material in the sub-groove is 40% to 60% of the height of the sub-groove.

In some possible implementations, the height of the bonding material in the groove is 40% to 60% of the height of the groove.

In some possible implementations, the material of the insulating construction layer comprises a resin material.

In some possible implementations, the welding pad comprises a first welding pad and a second welding pad, the groove comprises a first groove and a second groove, the first welding pad is exposed through the first groove, the second welding pad is exposed through the second groove, and a bonding material is accommodated in both the first groove and the second groove.

In another aspect, an embodiment of the present disclosure further provides a preparation method of a display substrate, comprising: forming a welding pad on the drive substrate, wherein the welding pad is electrically connected with the drive substrate; forming an insulating construction layer on the welding pad, wherein the insulating construction layer is provided with a groove for exposing the welding pad; and adding a bonding material into the groove, and electrically connecting a micro light emitting diode with the welding pad through the bonding material.

In some possible implementations, forming an insulating construction layer on the welding pad comprises: forming an insulating construction thin film on the drive substrate on which the welding pad is formed; and exposing and developing the insulating construction thin film by using a mask plate to form an insulating construction layer, wherein the insulating construction layer is provided with a groove for exposing the welding pad.

In some possible implementations, before the bonding material is added into the groove, the preparation method further comprises: forming a metal connection layer positioned in the groove, wherein a sub-groove corresponding to the groove is formed at an inner side of the metal connection layer, and the bonding material is accommodated in the sub-groove.

In some possible implementations, the forming an insulating construction layer on the welding pad comprises: sequentially forming an insulating construction thin film and a metal auxiliary thin film on the drive substrate on which the welding pad is formed; coating a layer of photoresist on the metal auxiliary thin film, mask exposing and developing the photoresist, and forming a fully exposed area at a position corresponding to the welding pad to expose the metal auxiliary thin film; etching the metal auxiliary thin film with the photoresist as a mask to form a metal auxiliary layer, wherein the metal auxiliary layer is provided with an auxiliary hole corresponding to the welding pad; and etching the insulating construction thin film with the metal auxiliary layer as a mask to form an insulating construction layer, wherein the insulating construction layer is provided with a groove corresponding to the auxiliary hole, and the welding pad is exposed through the groove and the auxiliary hole.

In some possible implementations, the forming a metal connection layer positioned in the groove comprises: depositing a metal connection thin film on the drive substrate on which the groove is formed, and coating a photoresist on the metal connection thin film, wherein the photoresist completely fills the groove; ashing the photoresist to expose the metal connection thin film positioned outside the groove; and etching the metal connection thin film and the metal auxiliary layer positioned outside the groove by a wet etching process, and removing residual photoresist to form a metal connection layer positioned in the groove, wherein the metal connection layer is in contact with a bottom surface and a side surface of the groove, a sub-groove corresponding to the groove is formed at an inner side of the metal connection layer; and the bonding material is accommodated in the sub-groove.

In some possible implementations, the insulating construction thin film is etched using a dry etching process.

In some possible implementations, the metal connection thin film and the metal auxiliary thin film are made of the same material.

In yet another aspect, an embodiment of the present disclosure also provides a display device comprising a display substrate, wherein the display substrate comprises a drive substrate and a welding pad provided on the drive substrate and electrically connected with the drive substrate; the display substrate further comprises an insulating construction layer provided on the welding pad, the insulating construction layer is provided with a groove for exposing the welding pad, a bonding material is accommodated in the groove, and a micro light emitting diode is electrically connected with the welding pad through the bonding material.

In some possible implementations, the display substrate further comprises a metal connection layer provided in the groove, an inner side of the metal connection layer forms a sub-groove corresponding to the groove, and the bonding material is accommodated in the sub-groove.

In some possible implementations, the depth of the sub-groove is greater than 3 μm.

In some possible implementations, the welding pad comprises a first welding pad and a second welding pad, the groove comprises a first groove and a second groove, the first welding pad is exposed through the first groove, the second welding pad is exposed through the second groove, and a bonding material is accommodated in both the first groove and the second groove.

Other features and advantages of technical solutions of the present disclosure will be set forth in the description which follows, and in part will become apparent from the description, or be learned by practice of the technical solutions of the present disclosure. Purposes and advantages of the technical solutions of the present disclosure may be realized and obtained by structures specifically indicated in the description, claims and drawings.

BRIEF DESCRIPTION OF DRAWINGS

Accompanying drawings are used to provide a further understanding of technical solutions of the present disclosure, form a part of the specification, and are used to explain technical solutions of the present disclosure together with embodiments of the present disclosure, but do not constitute a limitation on the technical solutions of the present disclosure.

DETAILED DESCRIPTION

In order to make purposes, technical solutions and advantages of the present disclosure clearer, embodiments of the present disclosure will be described in detail below with reference to the accompanying drawings. Those skilled in the art should understand that embodiments in the present disclosure and features in the embodiments may be combined with each other arbitrarily if there is no conflict.

Figure 1A:
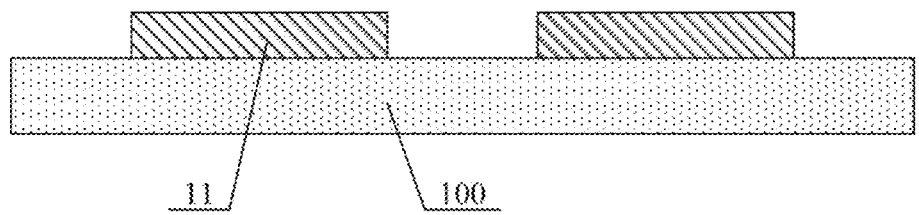
FIGS. 1a to 1c are schematic diagrams of a process of bonding a Micro-LED to a display substrate.
Figure 1B:
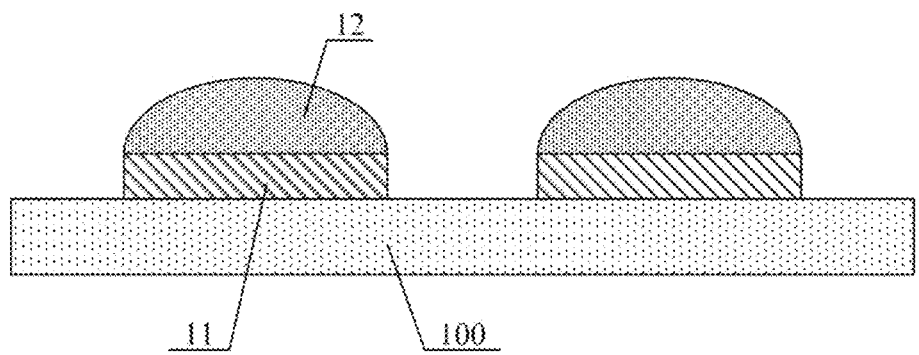
Figure 1C:
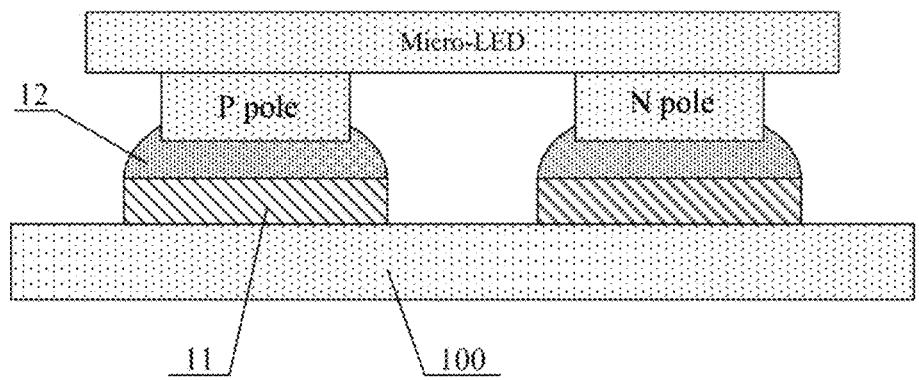

FIGS. 1a to 1c are schematic diagrams of a process of bonding a Micro-LED to a display substrate. Taking the standard 4K UHD (3840*2160) Micro-LED display substrate as an example, the display substrate has 8294400 pixels. For Micro-LEDs of R, G and B colors, a total of 24883200 Micro-LED chips are required and a large number of Micro-LEDs need to be bonded. Micro-LEDs can be bonded with one of silver paste, solder paste, anisotropic conductive adhesive and other adhesive materials.

As shown in FIG. 1a, a welding pad 11 for bonding a Micro-LED is provided on a drive substrate 100. When bonding a Micro-LED, it is needed to accurately control a dispenser to dispense solder paste 12 on the welding pad 11, as shown in FIG. 1b. The Micro-LED is transferred to the drive substrate 100 by transfer technology to realize bonding. The Micro-LED is bonded to the welding pad 11 through solder paste 12, as shown in FIG. 1c. During the process of bonding a Micro-LED, if too much solder paste is dispensed, the solder paste flow during the bonding process will easily cause the short circuit between the N pole and the P pole of the Micro-LED. In addition, if a Micro-LED is transferred using a micro-transfer head similar to polydimethylsiloxane (PDMS), when the upper surface of the micro-transfer head is separated from the Micro-LED, peeling may sometimes occur between the electrode of the Micro-LED and the welding pad 11, resulting in failure in bonding.

An embodiment of the present disclosure provides a display substrate. The display substrate comprises a drive substrate and a welding pad provided on the drive substrate and electrically connected with the drive substrate. The display substrate further comprises an insulating construction layer provided on the welding pad. The insulating construction layer is provided with a groove for exposing the welding pad. A bonding material is accommodated in the groove, and a micro light emitting diode is electrically connected with the welding pad through the bonding material.

According to the display substrate of the embodiment of the disclosure, when the Micro-LED is bonded and connected with the display substrate, the dispenser can be controlled to dispense a bonding material such as solder paste in the groove 22. The groove 22 can restrict the flow of the bonding material during the bonding process, so as to avoid short circuit between the N pole and the P pole of the Micro-LED caused by too much dispensing.

Technical contents of the present disclosure will be described in detail below through exemplary embodiments. Deposition may be performed by a known process such as sputtering, evaporation, and chemical vapor deposition, coating may be performed by a known coating process, and etching may be performed by a known method, which are not limited here.

Figure 2:
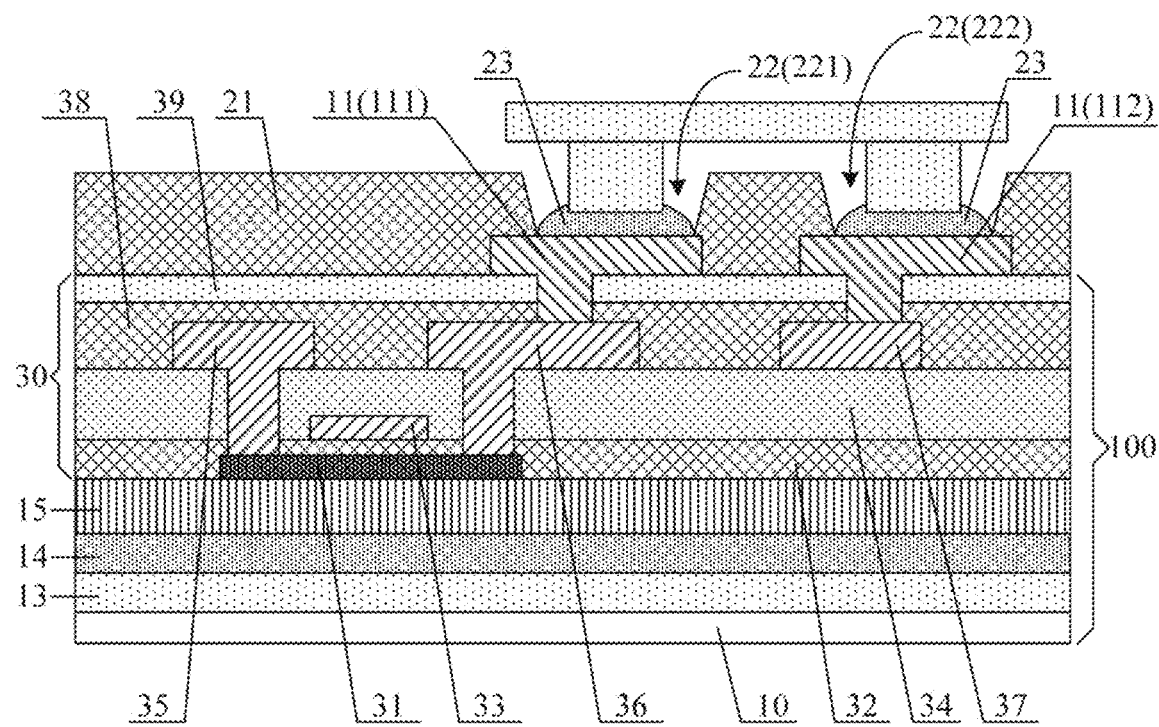
FIG. 2 is a schematic structural diagram of a display substrate in an exemplary embodiment of the disclosure.

FIG. 2 is a schematic structural diagram of a display substrate in an exemplary embodiment of the disclosure. As shown in FIG. 2, the display substrate comprises a drive substrate 100 and a welding pad 11 provided on the drive substrate 100 and electrically connected with the drive substrate 100. The display substrate further comprises an insulating construction layer 21 provided on the welding pad 11, and the insulating construction layer 21 is provided with a groove 22 for exposing the welding pad 11. A bonding material 23 is accommodated in the groove 22, and the pin of the micro light emitting diode is electrically connected with the welding pad 11 through the bonding material 23.

According to the display substrate of the embodiment of the disclosure, when the Micro-LED is bonded and connected with the display substrate, the dispenser can be controlled to dispense a bonding material such as solder paste in the groove 22. The groove 22 can restrict the flow of the bonding material during the bonding process, so as to avoid short circuit between the N pole and the P pole of the Micro-LED caused by too much dispensing.

In an exemplary embodiment, the depth of the groove 22 is greater than or equal to 3 μm. With the groove having such a depth, during the dispensing process, the dispenser can be controlled so as to make the dispensing amount of the bonding material about half of the height of the groove, which not only can ensure that the amount of the bonding material is sufficient to realize the bonding of the Micro-LED and the welding pad, but also can prevent the bonding material from overflowing the groove during the bonding process, so that the groove well restricts the flow of the bonding material, thereby avoiding the short circuit between the N pole and the P pole of the Micro-LED. In an exemplary embodiment, the height of the bonding material in the groove is 40% to 60% of the height of the groove, for example, the height of the bonding material in the groove is one of 40%, 45%, 50%, 55% and 60% of the height of the groove. This amount of bonding material is not only sufficient to bond the Micro-LED to the welding pad, but also the groove well restricts the flow of the bonding material, thereby avoiding the short circuit between the N pole and the P pole of the Micro-LED. A person skilled in the art may understand that "height of the groove" is the dimension of the groove in a direction perpendicular to the drive substrate.

In an exemplary embodiment, the material of the insulating construction layer 21 may comprises a resin material, such as one of photoresist, polyimide, and the like. A thicker insulating construction layer can be made using a resin material, thereby facilitating the formation of a groove 22 that meets the depth requirement. A person skilled in the art may understand that the material of the insulating construction layer can be other materials with insulating characteristics as long as a groove can be formed.

As shown in FIG. 2, the drive substrate 100 comprises a base substrate 10 and a drive structure layer 30 provided on the base substrate 10. The drive structure layer 30 comprises a thin film transistor (TFT) and a common electrode line 37. The common electrode line 37 is provided on the same layer as the source electrode or drain electrode of the thin film transistor.

In an exemplary embodiment, the welding pad 11 comprises a first welding pad 111 and a second welding pad 112, and the groove 22 comprises a first groove 221 and a second groove 222. The first welding pad 111 is exposed through the first groove 221 and the second welding pad 112 is exposed through the second groove 222. A bonding material 23 is accommodated in both the first groove 221 and the second groove 222. The first pole of the Micro-LED is electrically connected to the first welding pad 111 through the bonding material positioned in the first groove 221, and the second pole of the Micro-LED is electrically connected to the second welding pad 112 through the bonding material positioned in the second groove 222. The first welding pad 111 is electrically connected to the source electrode or drain electrode of the thin film transistor, and the second welding pad 112 is electrically connected to the common electrode line 37.

As shown in FIG. 2, the drive substrate further comprises a first resin layer 13, a second resin layer 14, and a buffer layer 15 which are sequentially provided between the base substrate 10 and the drive structure layer 30.

In an exemplary embodiment, the thin film transistor may be a top-gate thin film transistor. The drive structure layer comprises an active layer 31 provided on the buffer layer 15; a gate insulating layer 32 provided on the active layer 31; a gate electrode 33 provided on the gate insulating layer 32; an interlayer insulating layer 34 provided on the gate electrode 33; a source electrode 35, a drain electrode 36, and a common electrode line 37 which are provided on the interlayer insulating layer 34. The source electrode 35 and the drain electrode 36 are electrically connected to the active layer 31 through holes, respectively. The drive structure layer further comprises a flat layer 38 provided on the source electrode 35 and a passivation layer 39 provided on the flat layer 38. Both the first welding pad 111 and the second welding pad 112 are provided on the passivation layer 39. The first welding pad 111 is electrically connected to the source electrode or drain electrode through holes passing through the passivation layer 39 and the flat layer 38, and the second welding pad 112 is electrically connected to the common electrode line 37 through holes passing through the passivation layer 39 and the flat layer 38. A person skilled in the art may understand that the thin film transistor is not limited to a top-gate thin film transistor. In other embodiments, the thin film transistor may be a bottom-gate thin film transistor.

An embodiment of the present disclosure also provides a preparation method of a display substrate, comprising: forming a welding pad on a drive substrate, wherein the welding pad is electrically connected with the drive substrate; forming an insulating construction layer on the welding pad, wherein the insulating construction layer is provided with a groove for exposing the welding pad; and adding a bonding material into the groove, and electrically connecting a micro light emitting diode with the welding pad through the bonding material.

In an exemplary embodiment, forming an insulating construction layer on the welding pad may comprise: forming an insulating construction thin film on the drive substrate on which the welding pad is formed; and exposing and developing the insulating construction thin film by using a mask plate to form an insulating construction layer, wherein the insulating construction layer is provided with a groove for exposing the welding pad.

Taking the display substrate shown in FIG. 2 as an example, the technical scheme of a preparation method of a display substrate according to an embodiment of the present disclosure will be described in detail below.

In an exemplary embodiment, the preparation process of a display substrate comprises the following operations S11 to S14.

S11: forming a drive substrate. This step may include the following operations S111-S112.

S111: sequentially forming a first resin layer 13, a second resin layer 14, and a buffer layer 15 on the base substrate 10. The first resin layer 13, the second resin layer 14, and the buffer layer 15 may be formed by using an existing method in the art, which will not be described here.

S112: forming a drive structure layer 30 on the buffer layer 15. The drive structure layer 30 comprises a thin film transistor and a common electrode line 37, and the common electrode line 37 is provided on the same layer as the source electrode or the drain electrode of the thin film transistor. The drive structure layer can be formed by using an existing method in the art, which will not be described here. So far, the preparation of the drive substrate has been completed.

S12: forming a first welding pad 111 and a second welding pad 112 on the drive structure layer, wherein the first welding pad 111 is electrically connected to the source electrode or drain electrode of the thin film transistor, and the second welding pad 112 is electrically connected to the common electrode line 37. The first welding pad 111 and the second welding pad 112 may be formed by using an existing method in the art, which will not be described here.

Figure 3:
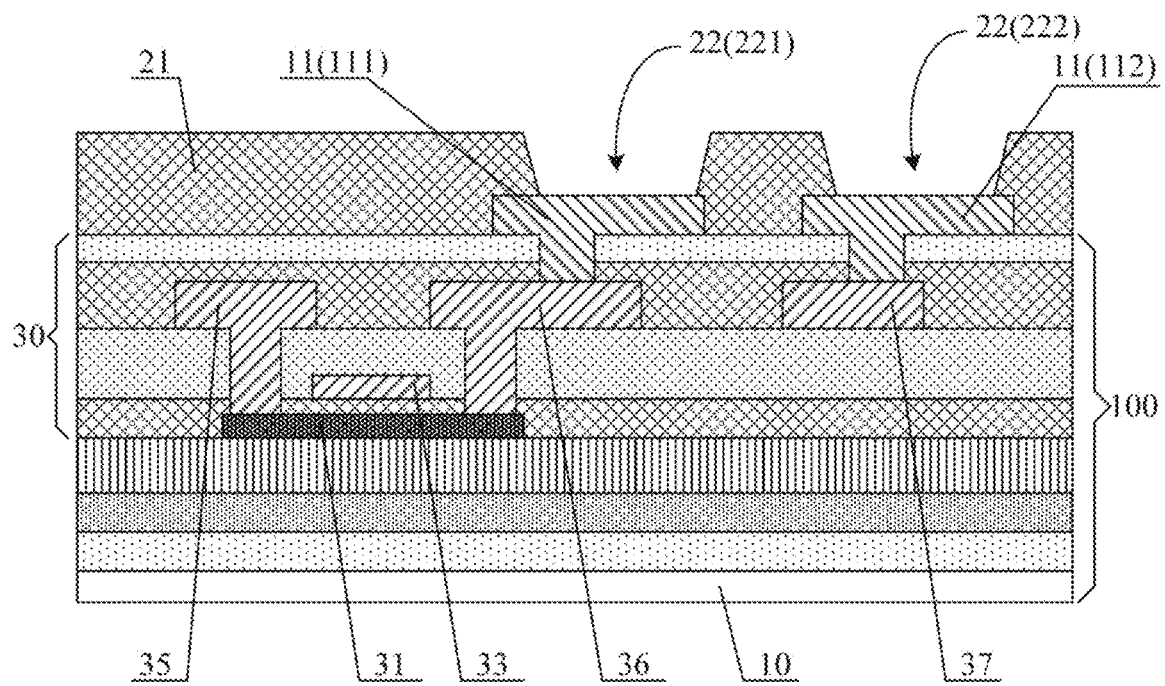
FIG. 3 is a schematic structural diagram of a display substrate after the formation of an insulating construction layer.

S13: forming an insulating construction layer 21 on the drive substrate on which the first welding pad 111 and the second welding pad 112 are formed, wherein the insulating construction layer 21 is provided with a first groove 221 corresponding to the first welding pad 111 and a second groove 222 corresponding to the second welding pad 112, the first welding pad 111 is exposed through the first groove 221, and the second welding pad 112 is exposed through the second groove 222. This step may include: coating the insulating construction thin film on the substrate on which the first welding pad 111 and the second welding pad 112 are formed, the thickness of the insulating construction thin film being greater than or equal to 3 μm; exposing and developing the insulating construction thin film using a mask plate to form fully exposed areas at the first groove and the second groove and form unexposed areas at other positions so as to form an insulating construction layer 21, wherein the first groove 221 for exposing the first welding pad 111 and the second groove 222 for exposing the second welding pad 112 are formed in the insulating construction layer 21, as shown in FIG. 3, which is a schematic structural diagram of a display substrate after the formation of an insulating construction layer. The material of the insulating construction layer comprises a resin material, such as one of photoresist, polyimide, and the like.

S14: adding a bonding material such as solder paste into the first groove 221 and the second groove 222 respectively by a dispenser in a vacuum environment; wherein the bonding of the Micro-LED is completed by a transfer process, the first pole of the Micro-LED is bonded and connected to the first welding pad 111 through the bonding material in the first groove 221, and the second pole of the Micro-LED is bonded and connected to the second welding pad 112 through the bonding material in the second groove 222, as shown in FIG. 2.

The drive structure layer 30 comprises a plurality of thin film transistors arranged in an array, and the Micro-LEDs on the display substrate are connected with the thin film transistors one by one correspondingly, so that the Micro-LEDs can form a plurality of pixels arranged in an array, and the Micro-LEDs are driven to work by the thin film transistors to realize display.

Figure 4:
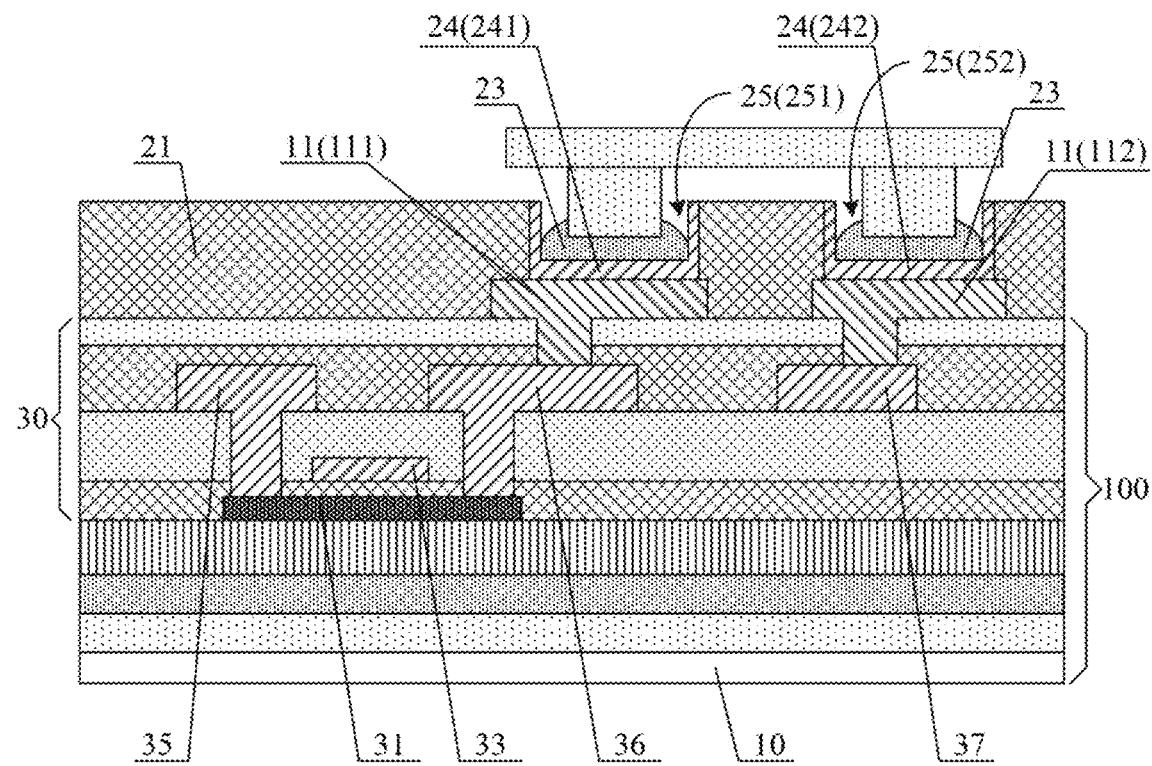
FIG. 4 is a schematic structural diagram of a display substrate in an exemplary embodiment of the disclosure.

FIG. 4 is a schematic structural diagram of a display substrate in an exemplary embodiment of the disclosure. As shown in FIG. 4, in an exemplary embodiment, the display substrate further comprises a metal connection layer 24 disposed in the groove 22. The metal connection layer 24 is in contact with both the bottom surface and the side surface of the groove, and the metal connection layer 24 is electrically connected with the welding pad 11. The inner side of the metal connection layer 24 forms a sub-groove 25 corresponding to the groove 22, and the bonding material is accommodated in the sub-groove 25. The micro light emitting diode is electrically connected with the metal connection layer 24 through the bonding material 23, and further is electrically connected with the welding pad.

According to the display substrate of the embodiment of the present disclosure, when the bonding material 23 is dispensed into the sub-groove 25 by the dispenser, the bonding material 23 can be in contact with both the bottom surface and the side surface of the sub-groove 25, so that the contact area between the bonding material 23 and the metal connection layer 24 is increased, reducing the connection resistance between the bonding material 23 and the metal connection layer 24, and thus reducing the connection resistance between the Micro-LED and the welding pad 11, improving the electrical connection performance between the Micro-LED and the welding pad 11, enhancing the bonding firmness of the Micro-LED, and avoiding a risk of the peeling between the electrode of the Micro-LED and the welding pad 11.

In an exemplary embodiment, the depth of the sub-groove 25 is greater than or equal to 3 μm. With the sub-groove 25 having such a depth, during the dispensing process, the dispenser can be controlled so as to make the dispensing amount of the bonding material about half of the height of the sub-groove, which not only can ensure that the amount of the bonding material is sufficient to realize the bonding of the Micro-LED and the welding pad, but also can prevent the bonding material from overflowing the sub-groove during the bonding process, so that the sub-groove well restricts the flow of the bonding material, thereby avoiding the short circuit between the N pole and the P pole of the Micro-LED. In an exemplary embodiment, the height of the bonding material in the sub-groove 25 is 40% to 60% of the height of the sub-groove. This amount of bonding material is not only sufficient to bond the Micro-LED to the welding pad, but also the sub-groove can well restrict the flow of the bonding material, thereby avoiding the short circuit between the N pole and the P pole of the Micro-LED.

An embodiment of the present disclosure also provides a preparation method of a display substrate, which may comprise: forming a welding pad on the drive substrate, wherein the welding pad is electrically connected with the drive substrate; forming an insulating construction layer on the welding pad, wherein the insulating construction layer is provided with a groove for exposing the welding pad; and adding a bonding material into the groove, and electrically connecting the micro light emitting diode with the welding pad through the bonding material.

In an exemplary embodiment, before the bonding material is added into the groove, the preparation method may further comprise: forming a metal connection layer positioned in the groove, wherein the metal connection layer is in contact with the bottom surface and the side surface of the groove, a sub-groove corresponding to the groove is formed at the inner side of the metal connection layer, and the bonding material is accommodated in the sub-groove.

In an exemplary embodiment, the forming an insulating construction layer on the welding pad may comprise: sequentially forming an insulating construction thin film and a metal auxiliary thin film on the drive substrate on which the welding pad is formed; coating a layer of photoresist on the metal auxiliary thin film, mask exposing and developing the photoresist, and forming a fully exposed area at a position corresponding to the welding pad to expose the metal auxiliary thin film; etching the metal auxiliary thin film with the photoresist as a mask to form a metal auxiliary layer, wherein the metal auxiliary layer is provided with an auxiliary hole corresponding to the welding pad; and etching the insulating construction thin film with the metal auxiliary layer as a mask to form an insulating construction layer, wherein the insulating construction layer is provided with a groove corresponding to the auxiliary hole, and the welding pad is exposed through the groove and the auxiliary hole.

In an exemplary embodiment, the forming a metal connection layer positioned in the groove may comprise: depositing a metal connection thin film on the drive substrate on which the groove is formed, and coating a photoresist on the metal connection thin film, wherein the photoresist completely fills the groove; ashing the photoresist to expose the metal connection thin film positioned outside the groove; and etching the metal connection thin film and the metal auxiliary layer positioned outside the groove by a wet etching process, and removing residual photoresist to form a metal connection layer positioned in the groove, wherein the metal connection layer is in contact with the bottom surface and the side surface of the groove, a sub-groove corresponding to the groove is formed at the inner side of the metal connection layer, and the bonding material is accommodated in the sub-groove.

In an exemplary embodiment, the insulating construction thin film is etched using a dry etching process.

In an exemplary embodiment, the metal connection thin film and the metal auxiliary thin film are made of the same material.

Taking the display substrate shown in FIG. 4 as an example, the technical scheme of a preparation method of a display substrate according to an embodiment of the present disclosure will be described in detail below.

In an exemplary embodiment, the preparation process of the display substrate comprises the following operations S21-S25.

S21: forming a drive substrate. This process is the same as S11, and will not be described again here.

Figure 5A:
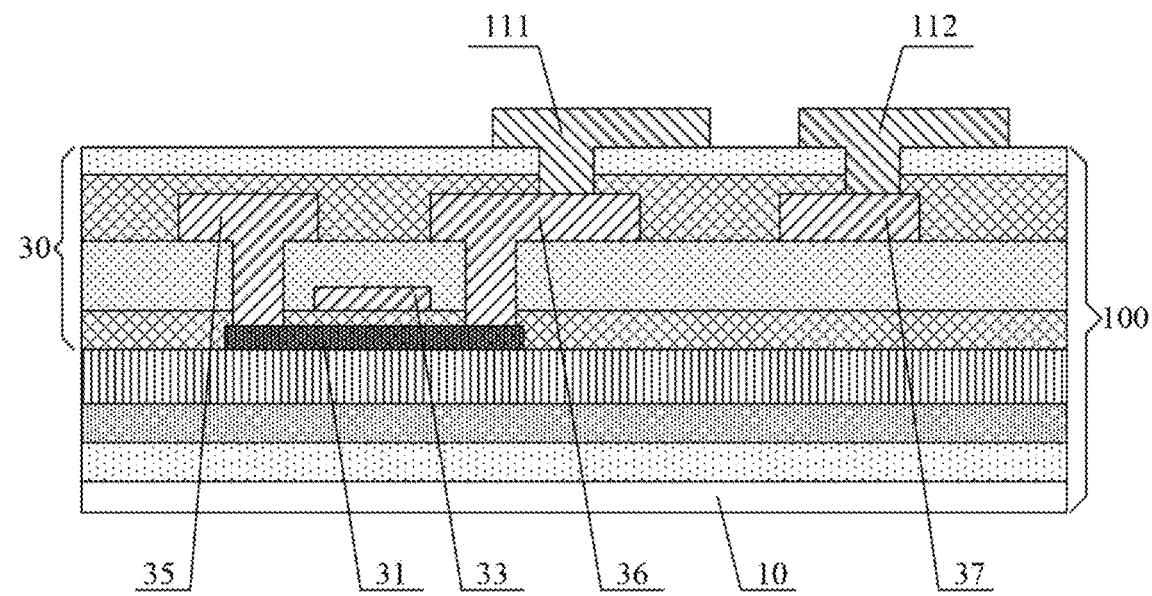
FIG. 5a is a schematic structural diagram of a display substrate after the formation of welding pads.

S22: forming a welding pad on the drive substrate, the welding pad being electrically connected to the drive substrate. This step may include: forming a first welding pad 111 and a second welding pad 112 on the drive structure layer, wherein the first welding pad 111 is electrically connected to the source electrode or drain electrode of the thin film transistor, and the second welding pad 112 is electrically connected to the common electrode line 37, as shown in FIG. 5a, which is a schematic structural diagram of a display substrate after the formation of welding pads. The method of forming the first welding pad 111 and the second welding pad 112 is the same as S12, and will not be described again here.

S23: forming an insulating construction layer on the welding pad, wherein the insulating construction layer is provided with a groove for exposing the welding pad. This step may include the following operations S231-S234.

Figure 5B:
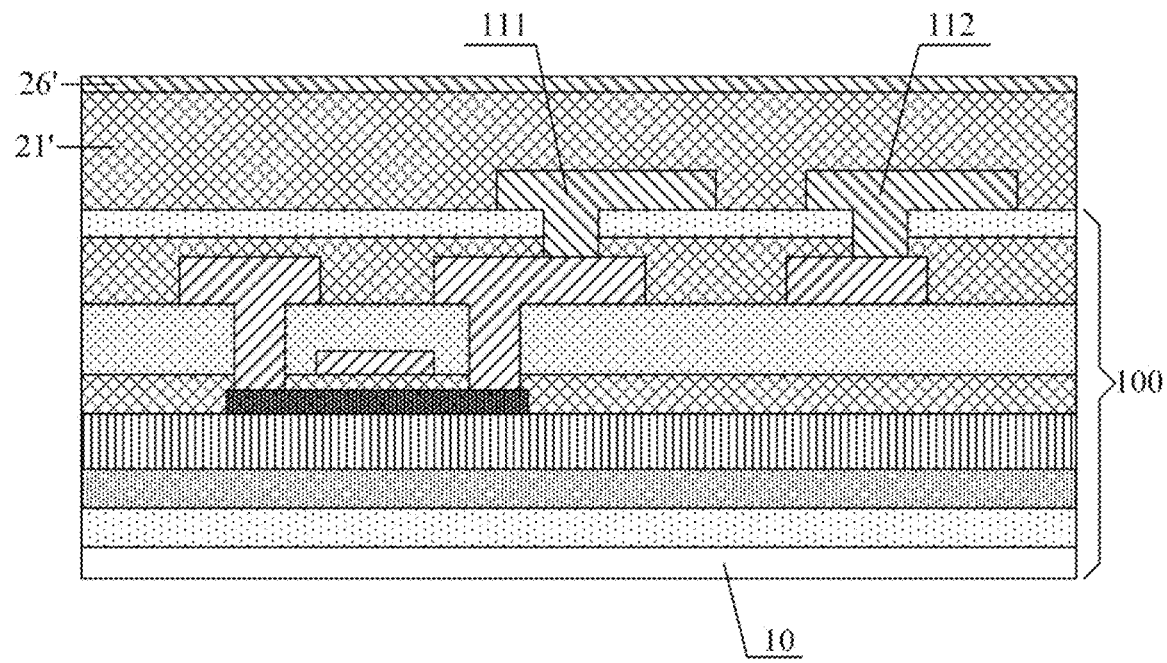
FIG. 5b is a schematic structural diagram of a display substrate after the formation of a metal auxiliary thin film.

S231: coating the insulating construction thin film 21' on the drive substrate on which the first welding pad 111 and the second welding pad 112 are formed, the thickness of the insulating construction thin film 21' being greater than 3 μm; depositing a metal auxiliary thin film 26' on the insulating construction thin film 21', as shown in FIG. 5b, which is a schematic structural diagram of a display substrate after the formation of a metal auxiliary thin film. The material of the insulating construction thin film may comprise a resin material, such as one of photoresist, polyimide, and the like. The material of the metal auxiliary thin film can be one or more of Pt, Ru, Au, Ag, Mo, Cr, Al, Ta, Ti, W and other metals.

Figure 5C:
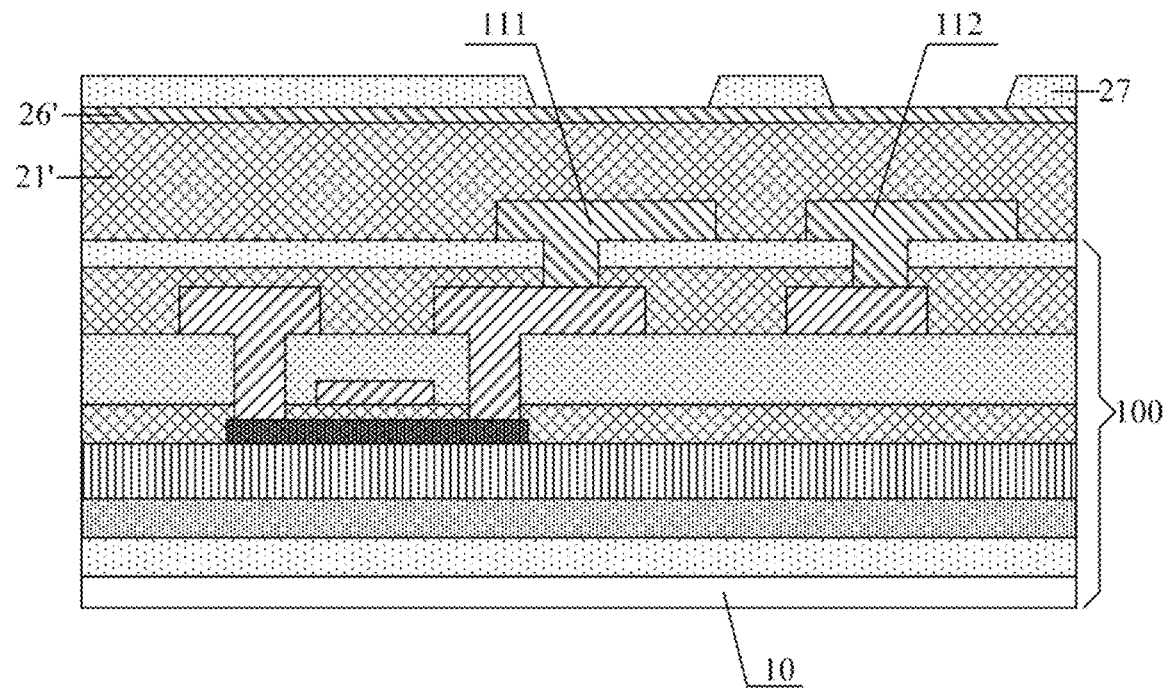
FIG. 5c is a schematic structural diagram of a display substrate after the formation of a photoresist.

S232: coating a layer of photoresist on the metal auxiliary thin film 26', mask exposing and developing the photoresist, forming fully exposed areas at positions corresponding to the first welding pad 111 and the second welding pad 112 respectively to expose the metal auxiliary thin film 26', and forming unexposed areas at other positions to retain the photoresist to form a photoresist layer 27, as shown in FIG. 5c, which is a schematic structural diagram of a display substrate after the formation of a photoresist.

S233: etching the metal auxiliary thin film 26' with the photoresist layer 27 as a mask to form a metal auxiliary layer 26. The metal auxiliary layer 26 is provided with a first auxiliary hole 261 corresponding to the first welding pad 111 and a second auxiliary hole 262 corresponding to the second welding pad 112. The metal auxiliary thin film 26' can be etched using a dry etching process to form a first auxiliary hole 261 corresponding to the first welding pad 111 and a second auxiliary hole 262 corresponding to the second welding pad 112, thereby forming the metal auxiliary layer 26.

Figure 5D:
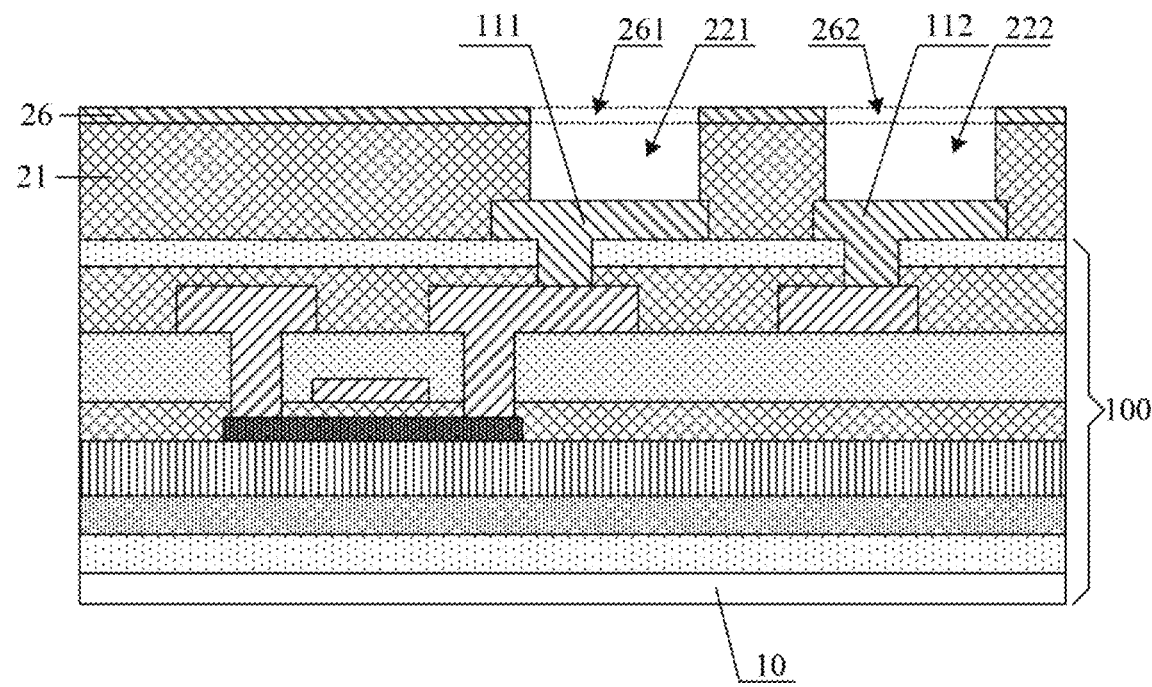
FIG. 5d is a schematic structural diagram of a display substrate after the formation of a groove.
Figure 6:
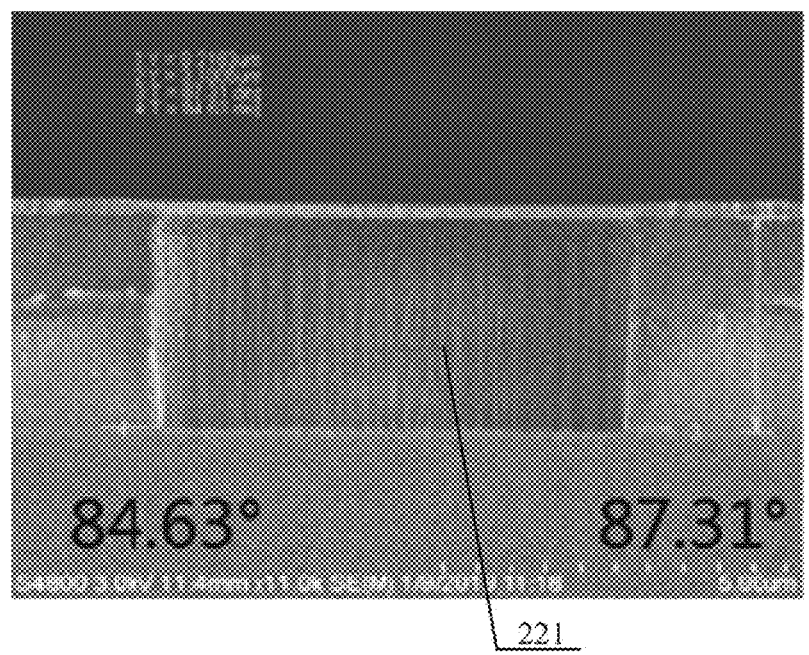
FIG. 6 is a schematic view of the effect at the first groove in FIG. 5d.

S234: etching the insulating construction thin film 21' with the metal auxiliary layer 26 as a mask to form a first groove 221 corresponding to the first auxiliary hole 261 and a second groove 222 corresponding to the second auxiliary hole 262. The first welding pad 111 is exposed through the first groove 221 and the first auxiliary hole 261, and the second welding pad 112 is exposed through the second groove 222 and the second auxiliary hole 262, as shown in FIG. 5d, which is a schematic structural diagram of a display substrate after the formation of a groove. The insulating construction thin film can be etched using a dry etching process. The sidewall of the formed first groove 221 is substantially perpendicular to the base substrate 10, and the sidewall of the second groove 222 is substantially perpendicular to the base substrate 10, as shown in FIG. 6, which a schematic view of the effect at the first groove in FIG. 5d. A person skilled in the art can understand that "substantially perpendicular" may include an angular range of 80° to 100°. For example, the angle between the sidewall of the first groove 221 and the base substrate 10 is about 84.6° or 87.3°, which can be understood that the sidewall of the first groove 221 is substantially perpendicular to the base substrate 10. A person skilled in the art can understand that the photoresist remaining on the metal auxiliary layer is also removed during the dry etching process of the insulating construction thin film.

S24: forming a metal connection layer positioned in the groove, wherein the metal connection layer is in contact with the bottom surface and the side surface of the groove, a sub-groove corresponding to the groove is formed at the inner side of the metal connection layer, and the bonding material is accommodated in the sub-groove. This step may include the following operations S241-S243.

Figure 5E:
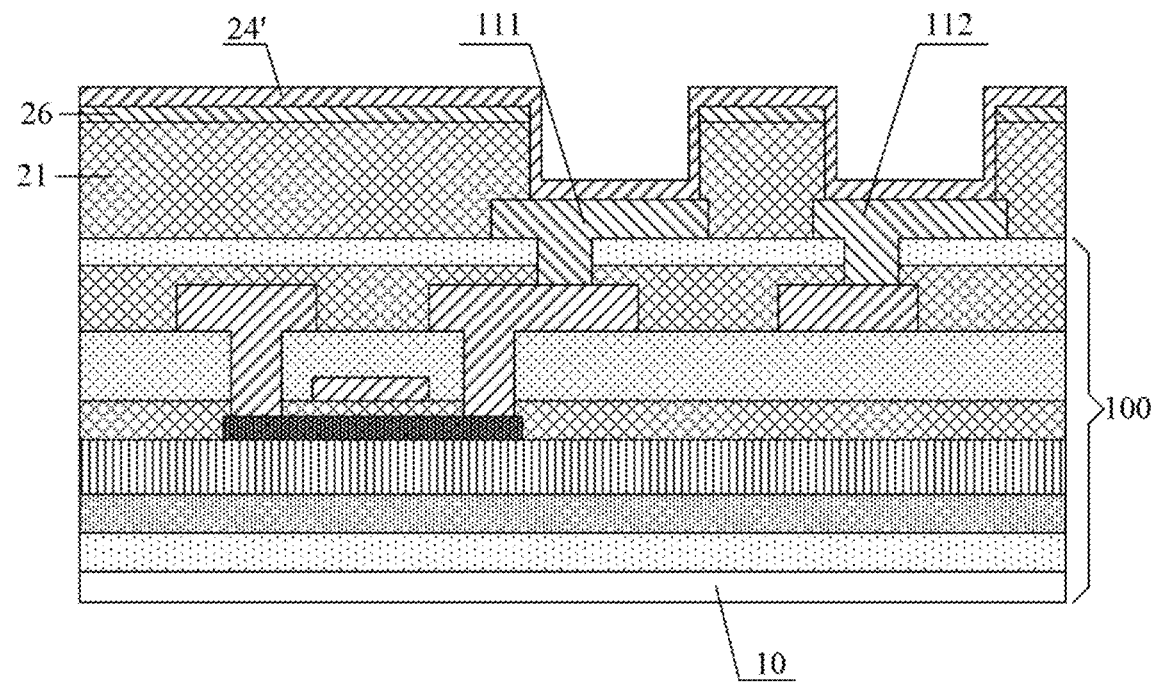
FIG. 5e is a schematic structural diagram of a display substrate after the formation of a metal connection thin film.
Figure 5F:
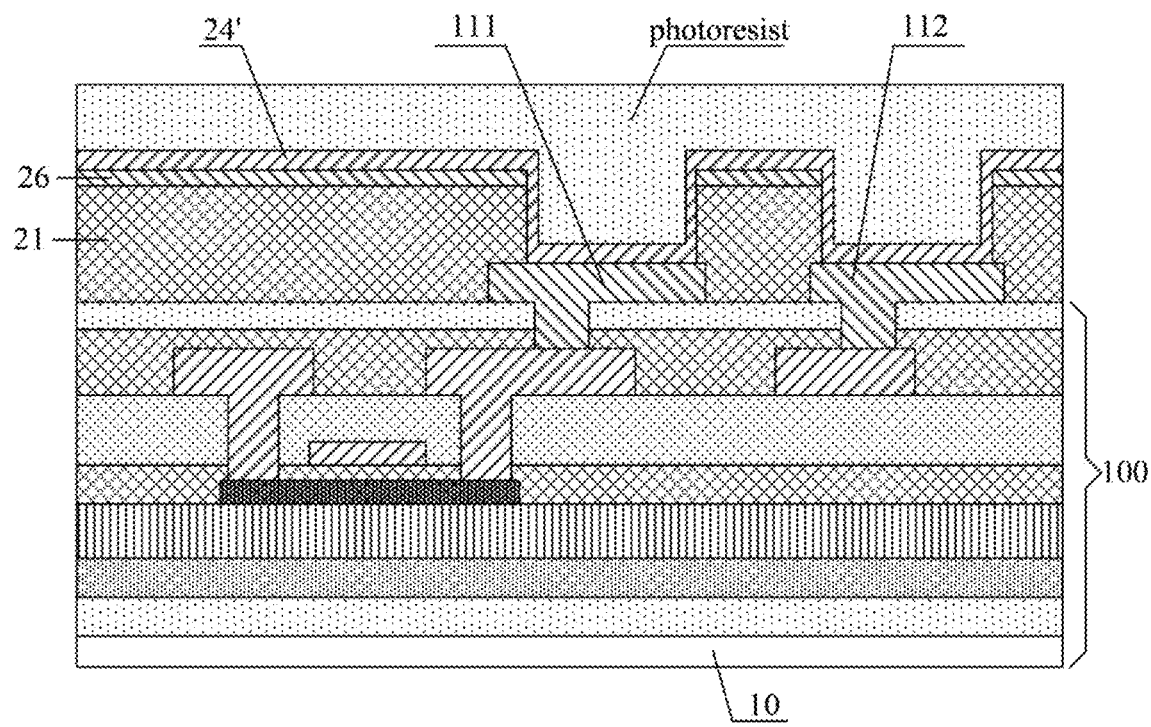
FIG. 5f is a schematic structural diagram of a display substrate after a photoresist is coated on a metal connection thin film.

S241: depositing a metal connection thin film 24' on the drive substrate on which the first groove and the second groove are formed, as shown in FIG. 5e, which is a schematic structural diagram of a display substrate after the formation of a metal connection thin film. The thickness of the metal connection thin film is 2500 to 3500 angstroms. For example, the thickness of the metal connection thin film may be one of 2500, 2600, 2700, 2800, 2900, 3000, 3100, 3200, 3300, 3400 and 3500 angstroms. In an exemplary embodiment, the thickness of the metal connection thin film may be 3000 angstroms. The material of the metal connection thin film may be the same as that of the metal auxiliary thin film. A photoresist is coated on the metal connection thin film 24', and the photoresist completely fills the first groove and the second groove, as shown in FIG. 5f, which is a schematic structural diagram of a display substrate after a photoresist is coated on a metal connection thin film.

Figure 5G:
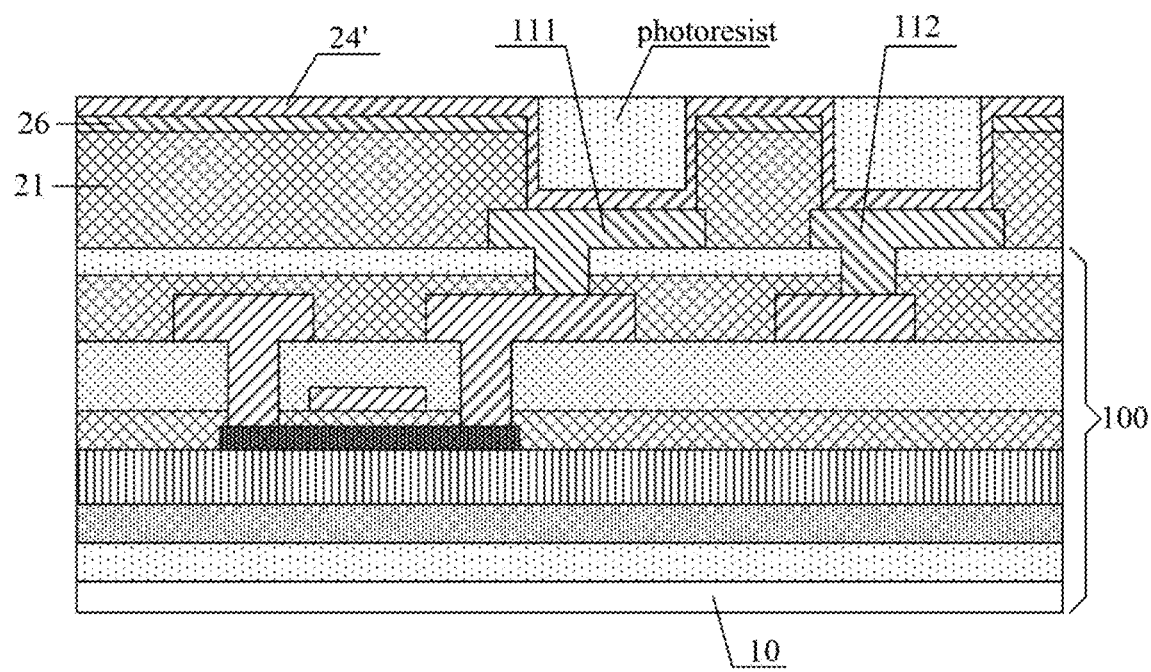
FIG. 5g is a schematic structural diagram of a display substrate after an ashing process.

S242: ashing the photoresist to expose the metal connection thin film 24' positioned outside the first groove and the second groove, as shown in FIG. 5g, which is a schematic structural diagram of a display substrate after an ashing process. The photoresist can be ashed by a dry etching process including oxygen plasma, and the photoresist can be thinned integrally, thereby exposing the metal connection thin film positioned outside the first groove and the second groove.

Figure 5H:
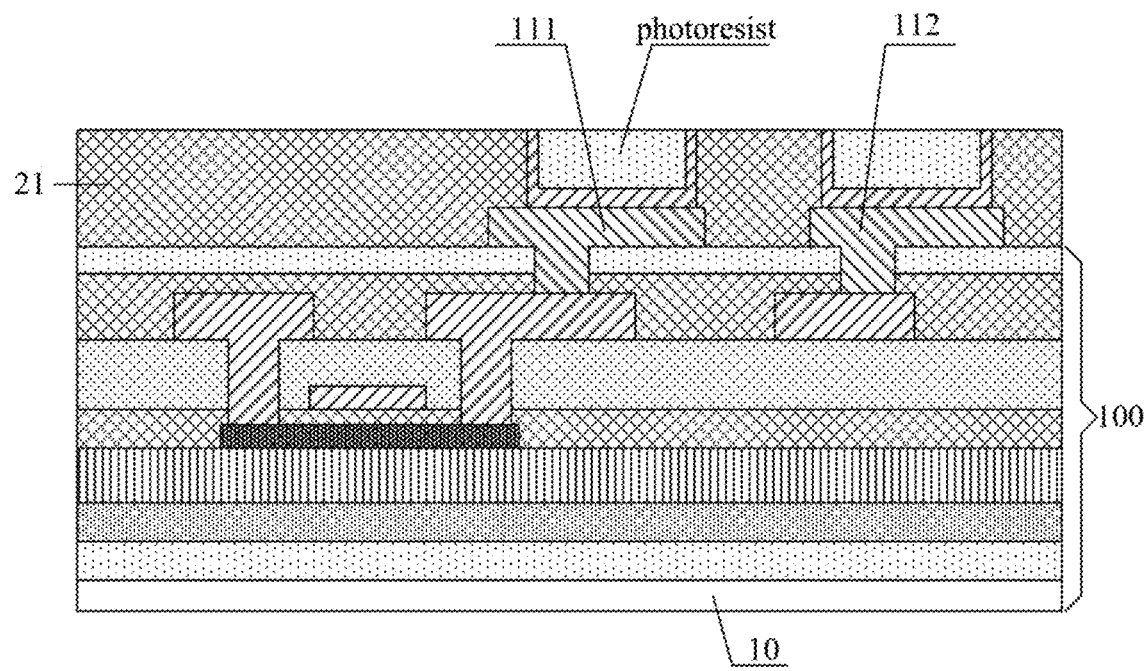
FIG. 5h is a schematic structural diagram of a display substrate after a wet etching process.
Figure 5I:
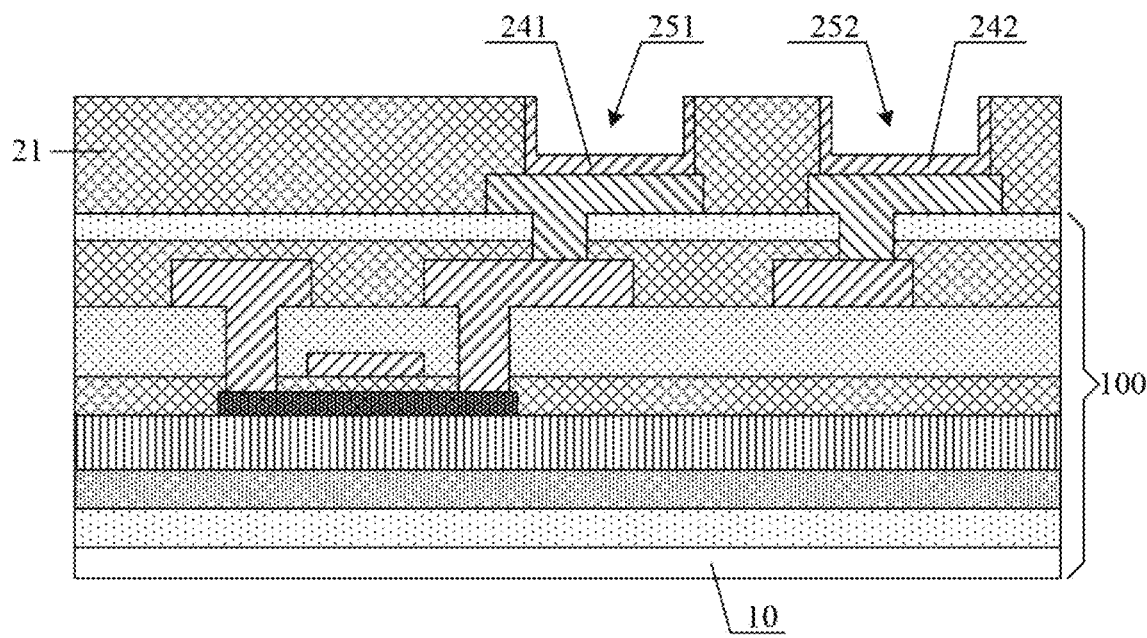
FIG. 5i is a schematic structural diagram of a display substrate after the formation of a sub-groove.
Figure 7:
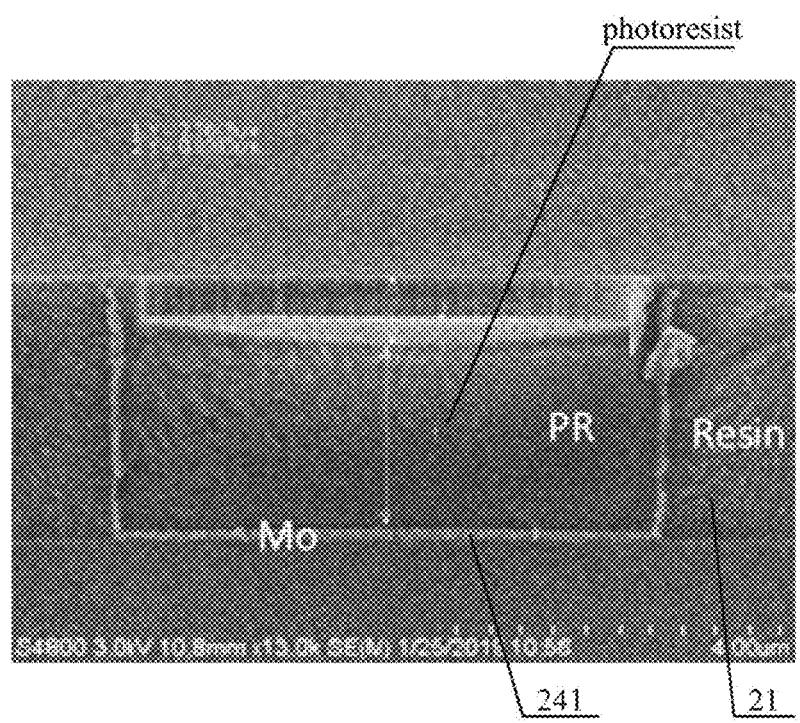
FIG. 7 is a schematic view of the effect at the first groove in FIG. 5h.

S243: etching the metal connection thin film 24' and the metal auxiliary layer 26 positioned outside the first groove and the second groove by a wet etching process, as shown in FIG. 5h and FIG. 7. FIG. 5h is a schematic structural diagram of display substrate after a wet etching process and FIG. 7 is a schematic view of the effect at the first groove in FIG. 5h. Then, the remaining photoresist is removed to form a first metal connection layer 241 positioned in the first groove and a second metal connection layer 242 positioned in the second groove. The inner side of the first metal connection layer 241 forms a first sub-groove 251 and the inner side of the second metal connection layer 242 forms a second sub-groove 252, as shown in FIG. 5i, which is a schematic structural diagram of a display substrate after the formation of a sub-groove.

S25: adding a bonding material such as solder paste into the first sub-groove 251 and the second sub-groove 252 by a dispenser in a vacuum environment, wherein the bonding material is in contact with the bottom surface and the side surface of the sub-groove; the bonding of the Micro-LED is completed by a transfer process, the first pole of the Micro-LED is bonded and connected to the first metal connection layer 241 through the bonding material in the first sub-groove 251, and the second pole of the Micro-LED is bonded and connected to the second metal connection layer 242 through the bonding material in the second sub-groove 252, as shown in FIG. 4.

An embodiment of the present disclosure also provides a display device comprising a display substrate according to an aforementioned embodiment. The display device may be any product or component with a display function, such as a mobile phone, a tablet computer, a television, a display, a notebook computer, a digital photo frame, a navigator.

In the description of the embodiments of the present disclosure, it should be understood that, an orientational or positional relationship indicated by terms "middle", "upper", "lower", "front", "rear", "vertical", "horizontal", "top", "bottom", "inner", "outside" or the like is based on the orientational or positional relationship shown in the drawings, which is only for ease of description of the present disclosure and simplification of the description, rather than indicating or implying that the stated device or element must have a specific orientation, or be constructed and operated in a particular orientation, and therefore cannot be understood as limiting the present disclosure.

In the description of the embodiments of the present disclosure, it should be noted that terms "install", "join" and "connect" shall be broadly understood unless otherwise explicitly specified and defined. For example, it may be a fix connection, a removable connection, or an integral connection; it may be a mechanical connection or an electrical connection; it may be a direct connection, or an indirect connection through an intermediate medium, or an internal communication between two elements. Those of ordinary skilled in the art can understand the specific meanings of the above terms in the present disclosure according to specific situations.

Although embodiments of the present disclosure are described in the above, the above embodiments are described only for easy understanding, rather than restricting the present disclosure. Any person skilled in the art to which the present disclosure pertains may make any modifications and variations in the forms and details of implementation without departing from the spirit and the scope disclosed in the present disclosure, but the patent protection scope of the present disclosure should still be subject to the scope defined by the appended claims.

What we claim is:

1. A display substrate, comprising a drive substrate and a welding pad provided on the drive substrate and electrically connected with the drive substrate; wherein the display substrate further comprises an insulating construction layer provided on the welding pad, the insulating construction layer is provided with a groove for exposing the welding pad, a bonding material is accommodated in the groove, and a micro light emitting diode is electrically connected with the welding pad through the bonding material;

wherein the welding pad comprises a first welding pad and a second welding pad, the groove comprises a first groove and a second groove, the first welding pad is exposed through the first groove, the second welding pad is exposed through the second groove, the first groove and the second groove are separate grooves, and the bonding material is accommodated in both the first groove and the second groove, so that a first electrode of the micro light emitting diode is electrically connected with the first welding pad through the bonding material in the first groove, and a second electrode of the micro light emitting diode is electrically connected with the second welding pad through the bonding material in the second groove.

2. The display substrate according to claim 1, wherein the display substrate further comprises a metal connection layer provided in the groove, a sub-groove corresponding to the groove is formed at an inner side of the metal connection layer, and the bonding material is accommodated in the sub-groove.

3. The display substrate according to claim 2, wherein the metal connection layer covers a bottom surface and a side surface of the groove, and a thickness of the metal connection layer is 2500 to 3500 angstroms.

4. The display substrate according to claim 2, wherein a depth of the sub-groove is greater than 3 µm.

5. The display substrate according to claim 2, wherein the drive substrate comprises a base substrate and a drive structure layer disposed on the base substrate, and a sidewall of the groove is perpendicular to the base substrate.

6. The display substrate according to claim 2, wherein a height of the bonding material in the sub-groove is 40% to 60% of a height of the sub-groove.

7. The display substrate according to claim 1, wherein a height of the bonding material in the groove is 40% to 60% of a height of the groove.

8. The display substrate according to claim 1, wherein a material of the insulating construction layer comprises a resin material.

9. A preparation method of a display substrate, comprising:
   forming a welding pad on a drive substrate, wherein the welding pad is electrically connected with the drive substrate;
   forming an insulating construction layer on the welding pad, wherein the insulating construction layer is provided with a groove for exposing the welding pad; and
   adding a bonding material into the groove, and electrically connecting a micro light emitting diode with the welding pad through the bonding material;
   wherein the welding pad comprises a first welding pad and a second welding pad, the groove comprises a first groove and a second groove, the first welding pad is exposed through the first groove, the second welding pad is exposed through the second groove, the first groove and the second groove are separate grooves, and the bonding material is accommodated in both the first groove and the second groove, so that a first electrode of the micro light emitting diode is electrically connected with the first welding pad through the bonding material in the first groove, and a second electrode of the micro light emitting diode is electrically connected with the second welding pad through the bonding material in the second groove.

10. The preparation method according to claim 9, wherein forming an insulating construction layer on the welding pad comprises:
   forming an insulating construction thin film on the drive substrate on which the welding pad is formed; and
   exposing and developing the insulating construction thin film by using a mask plate to form an insulating construction layer, wherein the insulating construction layer is provided with a groove for exposing the welding pad.

11. The preparation method according to claim 9, wherein before the bonding material is added into the groove, the preparation method further comprises:
   forming a metal connection layer positioned in the groove, wherein a sub-groove corresponding to the groove is formed at an inner side of the metal connection layer, and the bonding material is accommodated in the sub-groove.

12. The preparation method according to claim 11, wherein the forming an insulating construction layer on the welding pad comprises:
   sequentially forming an insulating construction thin film and a metal auxiliary thin film on the drive substrate on which the welding pad is formed;
   coating a layer of photoresist on the metal auxiliary thin film, mask exposing and developing the photoresist, and forming a fully exposed area at a position corresponding to the welding pad to expose the metal auxiliary thin film;
   etching the metal auxiliary thin film with the photoresist as a mask to form a metal auxiliary layer, wherein the metal auxiliary layer is provided with an auxiliary hole corresponding to the welding pad; and
   etching the insulating construction thin film with the metal auxiliary layer as a mask to form an insulating construction layer, wherein the insulating construction layer is provided with a groove corresponding to the auxiliary hole, and the welding pad is exposed through the groove and the auxiliary hole.

13. The preparation method according to claim 12, wherein the forming a metal connection layer positioned in the groove comprises:
   depositing a metal connection thin film on the drive substrate on which the groove is formed, and coating a photoresist on the metal connection thin film, wherein the photoresist completely fills the groove;
   ashing the photoresist to expose the metal connection thin film positioned outside the groove; and
   etching the metal connection thin film and the metal auxiliary layer positioned outside the groove by a wet etching process, and removing residual photoresist to form a metal connection layer positioned in the groove; wherein the metal connection layer is in contact with a bottom surface and a side surface of the groove, a sub-groove corresponding to the groove is formed at an inner side of the metal connection layer, and the bonding material is accommodated in the sub-groove.

14. The preparation method according to claim 12, wherein the insulating construction thin film is etched by a dry etching process.

15. The preparation method according to claim 13, wherein the metal connection thin film and the metal auxiliary thin film are made of the same material.

16. A display device comprising a display substrate, the display substrate comprising a drive substrate and a welding pad provided on the drive substrate and electrically connected with the drive substrate; wherein the display substrate further comprises an insulating construction layer provided on the welding pad, the insulating construction layer is provided with a groove for exposing the welding pad, a bonding material is accommodated in the groove, and a micro light emitting diode is electrically connected with the welding pad through the bonding material;
   wherein the welding pad comprises a first welding pad and a second welding pad, the groove comprises a first groove and a second groove, the first welding pad is exposed through the first groove, the second welding pad is exposed through the second groove, the first groove and the second groove are separate grooves, and the bonding material is accommodated in both the first groove and the second groove, so that a first electrode of the micro light emitting diode is electrically connected with the first welding pad through the bonding material in the first groove, and a second electrode of the micro light emitting diode is electrically connected with the second welding pad through the bonding material in the second groove.

17. The display device according to claim 16, wherein the display substrate further comprises a metal connection layer provided in the groove, a sub-groove corresponding to the groove is formed at an inner side of the metal connection layer, and the bonding material is accommodated in the sub-groove.

18. The display device according to claim 17, wherein a depth of the sub-groove is greater than 3 μm.

* * * * *